United States Patent
MacKenzie et al.

(10) Patent No.: US 9,099,679 B2
(45) Date of Patent: Aug. 4, 2015

(54) ENCAPSULATION PROCESS AND STRUCTURE FOR ELECTRONIC DEVICES

(75) Inventors: John Devin MacKenzie, Los Gatos, CA (US); Yuko Nakazawa, Santa Cruz, CA (US); Eric Jones, Santa Cruz, CA (US)

(73) Assignee: Sumitomo Chemical Company Limited, Tokyo (JP)

( * ) Notice: Subject to any disclaimer, the term of this patent is extended or adjusted under 35 U.S.C. 154(b) by 336 days.

(21) Appl. No.: 12/791,810

(22) Filed: Jun. 1, 2010

(65) Prior Publication Data
US 2010/0300746 A1 Dec. 2, 2010

Related U.S. Application Data

(60) Provisional application No. 61/183,013, filed on Jun. 1, 2009, provisional application No. 61/183,003, filed on Jun. 1, 2009.

(51) Int. Cl.
*H05K 3/30* (2006.01)
*H01L 51/52* (2006.01)
*H01L 23/26* (2006.01)

(52) U.S. Cl.
CPC ........ *H01L 51/5259* (2013.01); *H01L 51/5246* (2013.01); *H01L 23/26* (2013.01); *H01L 2924/0002* (2013.01); *Y10T 29/41* (2015.01); *Y10T 29/49002* (2015.01); *Y10T 29/49117* (2015.01); *Y10T 29/49146* (2015.01)

(58) Field of Classification Search
CPC . H01L 21/00; H01L 21/3225; H01L 51/5246; H01L 51/5259; H01L 2924/0002; H01L 2924/00; Y10T 29/49117; Y10T 29/41; Y10T 29/49002; Y10T 29/49146
USPC ........... 29/841, 25.01, 25.35, 592.1, 825; 438/471, 476, 477, 143, 310, 402; 174/525; 313/546, 547, 549, 553; 445/31, 41; 53/403
See application file for complete search history.

(56) References Cited

U.S. PATENT DOCUMENTS

| | | |
|---|---|---|
| 2,726,222 A | 12/1955 | Palmquist et al. |
| 5,682,043 A | 10/1997 | Pei et al. |
| 5,688,441 A | 11/1997 | Itagaki et al. |
| 5,734,225 A | 3/1998 | Biebuyck et al. |
| 5,888,925 A | 3/1999 | Smith et al. |
| 6,139,390 A | 10/2000 | Pothoven et al. |
| 6,146,225 A | 11/2000 | Sheats et al. |
| 6,268,695 B1 | 7/2001 | Affinito |

(Continued)

OTHER PUBLICATIONS

International Search Report and Written Opinion issued on Aug. 30, 2010 for PCT Application No. PCT/US2010/036972.

(Continued)

*Primary Examiner* — Peter DungBa Vo
*Assistant Examiner* — Azm Parvez
(74) *Attorney, Agent, or Firm* — Wolf, Greenfield & Sacks, P.C.

(57) ABSTRACT

Electronic devices, such as photovoltaic, transistor or doped light-emitting devices, can be manufactured with an air-based manufacturing process and device structure that encapsulates the device with air-stable electrodes and active layers that are reasonably stable in their unexcited state. A sheet of flexible material may act as a substrate and a second sheet of material acts as a cover. Getter materials are included in the encapsulated device, with the getter latent or unreactive during the manufacturing process.

22 Claims, 3 Drawing Sheets

(56) References Cited

U.S. PATENT DOCUMENTS

| | | |
|---|---|---|
| 6,365,036 B1 | 4/2002 | Polikarpus |
| 6,605,483 B2 | 8/2003 | Victor et al. |
| 6,635,989 B1 | 10/2003 | Nilsson et al. |
| 6,887,733 B2 | 5/2005 | Klausmann et al. |
| 2005/0227387 A1 | 10/2005 | Yokajty |
| 2005/0230691 A1* | 10/2005 | Amiotti et al. .................. 257/79 |
| 2005/0238803 A1 | 10/2005 | Tremel et al. |
| 2006/0076632 A1* | 4/2006 | Palmateer et al. ............ 257/414 |
| 2006/0128042 A1 | 6/2006 | Gramann et al. |
| 2006/0283546 A1* | 12/2006 | Tremel et al. ................. 156/291 |
| 2008/0003493 A1* | 1/2008 | Bates .............................. 429/66 |
| 2008/0171801 A1 | 7/2008 | Cho et al. |
| 2008/0187651 A1 | 8/2008 | Lee et al. |
| 2009/0167169 A1 | 7/2009 | Lee et al. |
| 2010/0148160 A1* | 6/2010 | Cao ................................. 257/40 |
| 2010/0270919 A1* | 10/2010 | Hubert et al. ................. 313/512 |

OTHER PUBLICATIONS

International Search Report and Written Opinion issued on Dec. 19, 2011 for PCT Application No. PCT/US2010/036937.

* cited by examiner

Jet Type

Pad Type

ENCAPSULATION PROCESS AND STRUCTURE FOR ELECTRONIC DEVICES

CROSS REFERENCE TO RELATED APPLICATIONS

This application claims priority from U.S. Provisional Application Ser. Nos. 61/183,013 and 61/183,003 filed Jun. 1, 2009.

FIELD OF THE INVENTION

This invention relates to the fabrication of light emitting polymer device modules, and more specifically it describes an encapsulation process for protecting electronic devices from ingress of degrading species from the external environment.

BACKGROUND OF THE INVENTION

Encapsulation of electronic devices is a very significant part of modern semiconductor technology, including inorganic and organic active material devices. Recently, organic semiconductor-based devices have been under development for display, lighting, energy conversion, energy storage, switching and logic applications. Degradation or parameter change of these devices due to the impact of species from the external environment has been a significant concern for many of these applications. In particular, in devices where high excitation densities, or less stable chemical or electronic states are formed during operation or as a result of their operation, inherent processing or materials composition, there is a risk of accelerated interaction with species such as $O_2$, $H_2O$, or $H_2$. These substances can be present in the atmosphere in which the device is manufactured or operated. In some cases, such as metal-insulator-metal type organic light-emitting diode devices, the devices contain materials unstable to reaction with $H_2O$ and $O_2$ even in their non-operating states. This would include device materials such as Ca, Ba, Li and related compounds that are used to facilitate charge injection into semiconducting active materials with low carrier densities. Common techniques to fabricate devices based on these types of materials include fabricating the active device on glass in an inert environment, then covering the top of the device by attaching a metal can or a second glass plate with adhesive, also in an inert atmosphere. An example of the basic configuration is shown in FIG. 1, with a device 11 mounted on bottom glass substrate 12 and metal can or top glass cover 14 secured with an adhesive layer 16. The glass and metal of this typical design provides a near hermetic seal. To extend storage and product lifetime in these types of devices, small solid, relatively thick and rigid patches of getters or desiccants 17 are placed within the free volume 18 within the encapsulation. The term "getter" is used in this specification to include materials with gettering, desiccating or scavenging functions. In this case, the high diffusive mobility of gaseous species leaking into the package and the very strong affinity and high sticking coefficient of these species on the getter patch lead to effective removal of potentially detrimental species from throughout the entire volume within the packaged device. Examples of suppliers and materials for this include SAES Dryflex, Dynic, Sud Chemie and others. Typical getter or desiccant patches are 80 microns thick to 3000 microns or more thick. A problem with this conventional encapsulation structure and technique is that the finished display is rigid, heavy, bulky, fragile and can be relatively expensive. For semiconductor devices made on plastic substrates, new technologies have been developed to create transparent, flexible barriers. One example is a series of alternating thin layers of polymer and inorganic materials to create a thin, transparent oxygen and moisture barrier layer that can be applied directly to the device or on to any plastic substrate. Several examples of these polymer-inorganic layered LEP devices can be found in U.S. Pat. Nos. 6,268,695; 6,146,225; 5,734,225; and 6,635,989. Again, application of these encapsulation layers is conducted in some inert environment. Metal foil type encapsulation layers can also be effective, in certain implementations, for device encapsulation. However, due to the environmental sensitivity of some conventional device materials, encapsulation needs to take place in a controlled environment in conventional approaches.

Electrochemical devices, including light emitting electrochemical devices, can be formed without the use of reactive and low work function metals or with reduced activity or amounts of low work function materials. However, in operation these materials can still be somewhat sensitive to excess moisture, oxygen and hydrogen. For the formation of devices at low manufacturing cost, reduction of oxygen is of particular interest. Manufacturing in air is advantageous for reducing manufacturing line complexity and cost as well as increasing throughput. In some cases, it is possible to dry and remove moisture, as well as hydrogen, solvents or other impurities, from the air in the proximity of the manufacturing line. However, the removal of oxygen precludes direct human access to those parts of the equipment. It is therefore advantageous in a device manufacturing process to allow the presence of oxygen. However, oxygen sealed in the device after manufacture can shift operation parameters and cause accelerated degradation.

SUMMARY OF THE INVENTION

Utilization of a getter for oxygen in a device package that was formed in air, such that the getter removes the oxygen during or after sealing of the device, can allow a low cost, less complex and less expensive manufacturing process of higher performance devices.

In some cases where solution-based deposition processes are used for the formation of an electronic device or device encapsulation materials, residual solvents can be a problem. Residual solvents can affect device performance and reduce device operating lifetimes. Drying of the device or encapsulation materials in ovens, gas flows or through IR exposure adds to manufacturing time, complexity and cost. The inclusion of a material into the final device package that getters solvents at later stages in the process or after the device package is sealed, can reduce the need for extrinsic solvent removal processes. Also, encapusulation materials themselves can be sources of detrimental solvents or by-products from their deposition process. In other cases, adhesive or sealant conversion or curing, which can occur during the manufacturing process or after the device is sealed, can produce reaction by-products which may affect device performance. In such cases, it is advantageous to include getters to remove these species.

In addition, some electronic devices, such as photovoltaic, transistor or doped light-emitting devices (for example, those described in U.S. Pat. No. 5,682,043), may not contain materials that are highly unstable to the presence of $H_2O$, $O_2$ and other species in their unexcited state. However, these materials may become more reactive once charged and uncharged excitations are formed in the materials, for example through radiation exposure which may create electron hole pairs or free charge, or electrical stimulation that may inject free charge which may also lead to the formation of bound electron-hole states. These free, polaronic or excitonic states can be more susceptible to photo oxidation or other degradation processes. These devices present a special opportunity for simpler manufacturing and long shelf life devices that can be enhanced by the present invention. As these devices are not reactive in their "inactive" state, they can be processed in relatively easy to maintain ambient atmospheres, requiring less vacuum, inert gas or other types of more expensive and complex manufacturing environments. This is of particular advantage in manufacturing processes such as printing and web processing where environmental control can be difficult to maintain and/or requires complex tool integration and maintenance to effectively operate the manufacturing tools if they are modified to include or are surrounded by special inert environments. Moreover, although the device can be manufactured under reduced environmental control, reaction with $O_2$, $H_2O$, or $H_2$ in the device during its later operation or upon exposure to radiation, can result in substantial degradation. These reactive gases can be present in the encapsulated module after manufacture and can be present in the device due to ingress from the environment during its storage or useful lifetime. Also, these gasses and other potential degradation species such as molecular fragments, residual solvent, radicals and reactive gases, may be generated by intrinsic reaction over time or during operation due to outgassing or reaction byproducts of active species.

The present invention provides an improved, air-based manufacturing process and device structure for encapsulating an electronic device (such as an organic semiconductor, an organic light emitting diode, a light emitting polymer, an organic light emitting electrochemical cell, or similar devices) with air-stable electrodes and active layers that are reasonably stable in their unexcited state, where the first sheet may act as the substrate and the second sheet as a cover, and at least one of the sheets is transparent.

IN THE DRAWINGS

Figure 5A:
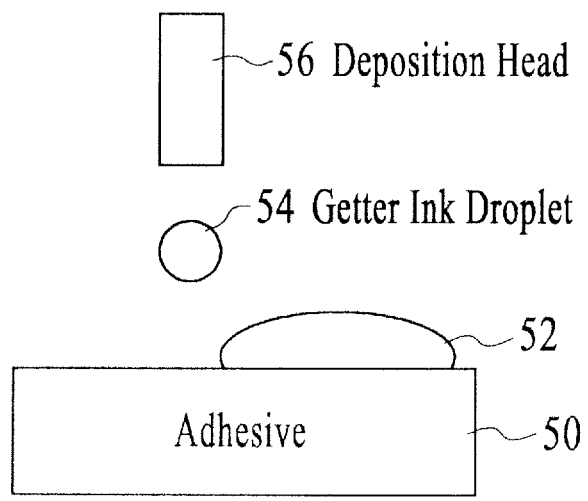
Figure 5B:
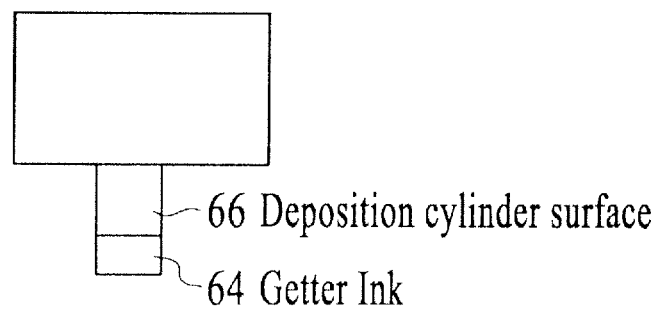
Figure 5B:
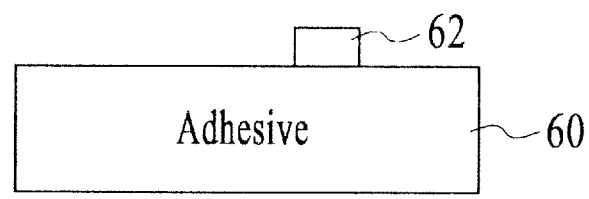

FIGS. 5(a) and 5(b) show two alternative ways to apply getter to an adhesive.

DETAILED DESCRIPTION OF THE INVENTION

In the present invention, electronic devices, such as doped polymer light emitting diodes, light-emitting electrochemical cells, organic photovoltaics and organic/inorganic hybrid photovoltaic cells, are encapsulated by the use of thin preformed or printed latent-acting getters, such that detrimental species or remnants resulting from or included during the manufacturing process or resulting from device operation, including $H_2O$, $O_2$, and residual solvents, are removed from the package after sealing and before or during later device operation.

Getter materials can include zeolites, metal oxides, organometallics or other materials that can be suspended in volatile solvents and organic binders, as appropriate. It is particularly advantageous if they can reduce the $O_2$ and $H_2O$ levels to <10 ppm levels within the package. Furthermore, they need to maintain a pumping rate to compensate for the leakage of encapsulation materials. Current flexible substrates of interest for flexible OLEDs and other organic electronic devices vary in water barrier properties from $10^{-3}$ to $10^{-4}$ g/m²/day. Based on this, to maintain low humidity levels in the device (<100 ppm, preferably <10 ppm for longest lifetimes), getter pumping rates on the order of $10^{-4}$ g/hr-cm² are needed, which are attainable in getter materials such as fine scale or highly porous zeolites and oxide getter systems (for example SAES Getters Italy DryFlex type).

Target product lifetimes devices ranging from 1 to 5 years or more, and getter capacities on the order of one mg/cm² or more, can be achieved. Latent acting or delayed acting getters can be created using solvents, getter access blocking materials, or intrinsic molecular reactions that are removed or changed to an activated state, thereby ensuring that the getter is not consumed during device fabrication. This change or activation may be a result of blanketing solvent, surfactant, or other material loss during drying, heating or radiation exposure that activates them late in the encapsulation process or after the device is actually sealed. In the later case, it is of interest that the solvents or released by-products that occur after the getter is sealed with the device are not damaging to the device.

Figure 1:
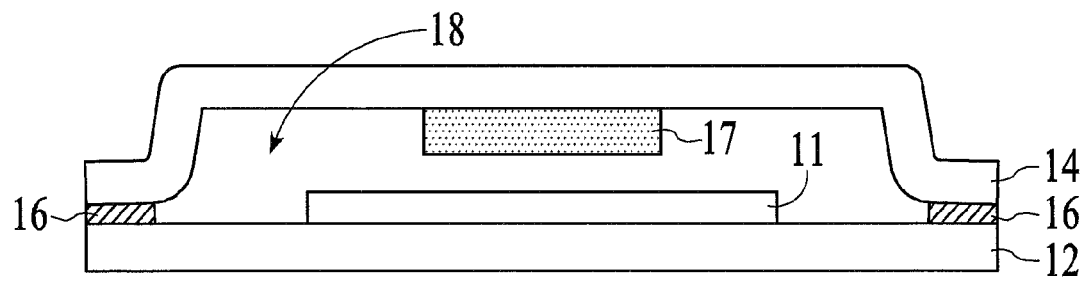
FIG. 1 illustrates conventional metal can type encapsulation structure with small getter and large free volume.

Furthermore, it is particularly advantageous if this getter can be printed as a patternable, thin (<100 micron), or flexible layer. It is further advantageous in a conformal or semi-conformal encapsulation structure, that is one in which the adhesive and encapsulation films are in direct contact with the backside of the electronic device or the getter on the device, when the getter is patterned in two dimensions to correspond to the active area of the device and or its interconnects. In a conventional structure such as that of FIG. 1, the high diffusivity of gas species in the free volume within the encapsulation structure allows a relatively small and localized getter to remove unwanted gaseous species from throughout the device. However, in a conformal structure, the free volume, not filled by solid or semi-solid materials is minimized or eliminated. This reduces the transport of $H_2O$, $O_2$, and other species within the device package and restricts the effect of local gettering on reducing the concentration of these species throughout the device package.

Figure 2:
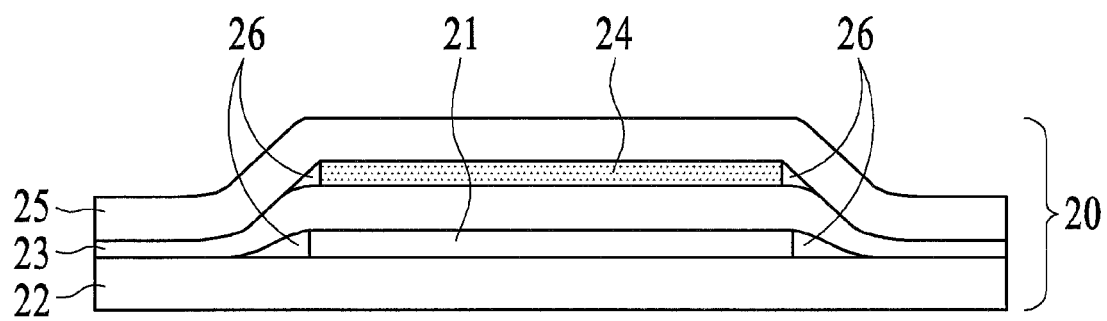
FIG. 2 shows a semi-conformal encapsulation structure with getter adjacent to an encapsulation film.
Figure 3:
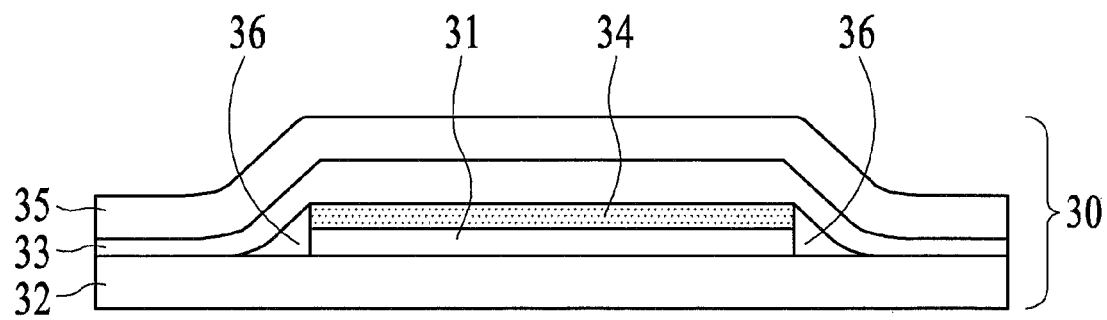
FIG. 3 illustrates a semi-conformal encapsulation structure with getter adjacent to the active device.

In the conformal or semi-conformal (semi-conformal is one in which there may still be small voids of free space, particularly at the edges of raised device features) structure of the present invention such as those shown in FIG. 2 or FIG. 3, there is a correspondence between the getter area and the active device area, where degradation of the device active materials is most relevant or the interconnect area.

FIG. 2 shows a semi-conformal encapsulation structure 20. Active device 21 is mounted on bottom barrier substrate 22. Adhesive layer 23 overlays device 21, with getter 24 adjacent to a backside encapsulation film 25. Small trapped air or gas pockets 26 exist at the edges of active device 21 and where package features interconnect (such as where the getter 24 meets encapsulation film 25).

FIG. 3 illustrates an alternative semi-conformal encapsulation structure 30 with active device 31 mounted on a bottom barrier substrate 32. Getter 34 is adjacent to the device 21, and overlaid by adhesive layer 33 and encapsulation film 35. Trapped air or gas pockets 36 exist at the edges of device 31 and getter 34.

In the structures of FIGS. 2 and 3, detrimental species originating in or near the active areas or interconnects, or ingressing near the active areas or interconnects, will be close to a getter material with strong affinity for the detrimental species, such that the detrimental species is substantially removed before it can interact with active materials in the device. In a typical flexible encapsulation structure, the thickness of device may be 50-300 microns, whereas the edge seal distance and/or separation of active pixels or devices within a single overall package might vary from approximately 100 microns to several millimeters. The thickness of the adhesive layer above or behind the planar device is preferably <50 microns, more typically 25 microns and would more preferably be 12.5 microns or less to reduce package thickness, increase flexibility, and reduce edge seal leakage of the package. This thinness of the adhesive layer further enables the placement of the getter immediately adjacent to the backside encapsulation film, as shown in FIG. 2. This means that the diffusion distance of unwanted species ingressing from the front-side of the device or coming from the active layer itself, to the getter film is a relatively short distance. In practice this is useful for printed getter materials or liquid getter precursors, which are advantageous from the perspective of direct patterning and because they can be easily processed in a liquid form, in some cases in air, and then converted or activated later in the process. Often a liquid material that is printed, dispensed or otherwise placed directly on an electronic device can cause device degradation through solvent problems, interdiffusion or other effects. Separating the getter from the device by the adhesive, either by printing, dispensing or placing the getter materials or precursor first on the back side encapsulation film or on top of the adhesive can limit negative interactions between the getter materials or precursor and the device during processing or after fabrication.

Figure 4:
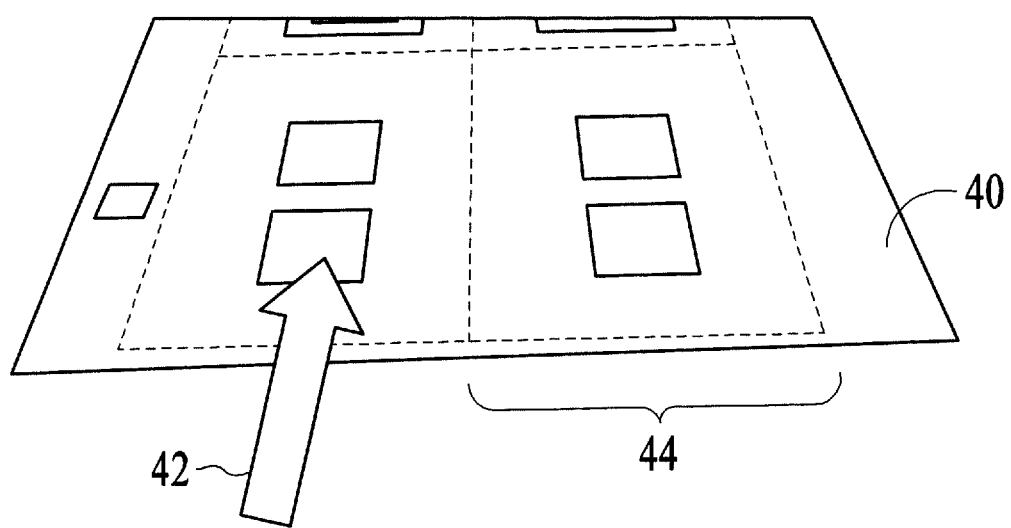
FIG. 4 illustrates a getter directly deposited and patterned by screen printing onto a flexible barrier substrate.

FIG. 4 illustrates direct deposition and patterning of a getter by screen printing onto a barrier substrate 40 that serves as an encapsulation film. The pattern is designed such that the larger getter areas 42 will directly overlap the active areas of the device underneath. For example, area 42 could be a 1 cm$^2$ getter pattern that corresponds to an underlying device active area. The pattern of the getter areas 44 (shown as a rectangle of substrate with two square getter areas) may be customized to the particular design needed. The absence of getter in between adjacent devices allows for better mechanical robustness of the overall package as the interspersed areas of contact between adhesive and top and bottom barrier film in the interior of the package prevent buckling and increase mechanical strength to delamination.

In the conformal encapsulation structure described here, the patterned getter could be between the device and the adhesive or it could be between the adhesive and the encapsulation film or other additional layers. In either case, the use of a novel getter combination or a getter which is latent acting, initially slowly acting or activated after lamination is also advantageous.

It has been observed experimentally that conformal or semi-conformal encapsulation of organic light emitting devices on flexible substrates with liquid adhesive, such as liquid epoxy, often results in damage of the device due to interactions between the liquid adhesive and the device during encapsulation. To prevent this, buffer layers may be used to protect the device from the adhesive, but some negative interactions are still possible. Dry film adhesives are attractive alternates to liquid adhesives, since the adhesive components can be fixed in the solid adhesive film or less mobile, leading to less interaction when in proximity to an electronic device. Furthermore, these dry adhesives can be handled in roll and sheet processing operations and allow for easy maintenance of a constant thickness over the encapsulation seal. However, during application of the adhesive, voids can form which are difficult or impractical to fully remove. This is due to the solid nature of the dry film adhesive and the resulting lack of complete conformality over device features which can have edge steps or features that vary in size from hundreds of nanometers to several microns. Examples of features which would produce such a step are printed low resistance conductors for electrodes and interconnects or getter regions themselves. Although lamination pressures can be increased, adhesive flow properties increased, and lamination temperatures increased to try to resolve this, as a practical matter lamination encapsulation with dry film or semi-solid adhesives over internal features with steps can result in the entrapment of air or other process gasses. Lifetime of printed polymer light emitting devices with semi-conformal encapsulation over raised features, such as getter regions, that was performed in air, even with local inert gas purge, results in very substantially reduced device performance in terms of luminance lifetimes and voltage rise as compared to a device encapsulated under dry inert gas (below 5 ppm $O_2$ or $H_2O$ for example).

For the particular case of a printed, doped polymer light emitting device, the use of desiccants that had significant water gettering capacity, even after brief exposure to air during the encapsulation process, did not result in long device lifetimes. This is not related to cathode degradation as would be the case in some organic light emitting diodes, as these structures did not contain cathodes or emitters that are intrinsically unstable to exposure to atmospheric water and oxygen level. However, devices with reduced physical steps within the adhesive/device encapsulation area, and therefore smaller voids for entrapping air and gas, had significantly longer lifetimes. The difference in performance is believed to be due to the reduced quantities of oxygen or other unwanted substances trapped within the encapsulation structure. Although in some instances, it may be possible to use a structure without significant internal physical steps and thereby avoid this problem, in many practical cases this is not possible. For example, the inclusion of materials and structures within the device package such as electrodes, interconnects and getters can result in vertical features on the scale of microns to hundreds of microns. These features could result in substantial voids which would trap unwanted air or other substances.

We have found that the inclusion of an oxygen getter and a water getter in a semi-conformally encapsulated light-emitting device, processed and sealed in air, resulted in markedly improved performance over devices incorporating a water getter alone.

TABLE 1

| Method | Getter and Adhesive Configuration | Time to Half Luminance [Hrs] |
| --- | --- | --- |
| 1: Lamination and UV in air | No getter/Dry film adhesive | 150 |
| | No getter/Epoxy adhesive | 280 |
| | H2O + O2 getter/Dry film adhesive | 460 |
| 2: Lamination with local N2 purge and UV in air | No getter/Dry film adhesive | 140 |
| | H2O + O2 getter/Dry film adhesive | 620 |
| | H2O getter/Dry film adhesive | <1 |
| 3: Lamination in N2 and UV in air | No getter/Dry film adhesive | 200 |
| | H2O getter/Dry film adhesive | 1083 |
| 4: Controls - Lamination in N2 and UV in N2 | No getter/Dry film adhesive | 180 |
| | H2O + O2 getter/Dry film adhesive | 760 |
| | H2O getter/Dry film adhesive | 1580 |

Results from a doped polymer light emitting device encapsulation experiment showing the effects of different encapsulation environments and getter and adhesive configurations. All tests were based on equivalent devices fabricated on a front side ITO + barrier substrate and equivalent backside encapsulation films. Different getter and adhesive combinations were incorporated into the device by lamination of the device, adhesive, getter and backside film into a conformal or semi-conformal laminate (as shown in FIGS. 2-3). Devices were tested under constant current drive while measuring their forward luminance. Device lifetime was determined as the time it took for the device luminance to drop to half of its peak value.

Results from the tests shown in Table 1 can be summarized as follows: (1) Devices encapsulated in air, without getter and with a more conformal structure, including dry film and liquid epoxy adhesive which show very little trapped air void space, were substantially better than $H_2O$ getter-only semi-conformal devices sealed in air (not shown) or sealed in air with local $N_2$ purge. (2) $O_2$ getters significantly improved air encapsulated device performance. (3) Local $N_2$ purge was not effective by itself, but further improved $O_2$ getter performance. In this way, it was shown that it is possible to allow for air encapsulation of organic light emitting devices and still achieve long device lifetimes by subsequent removal of oxygen from the package after sealing. There would be an additional benefit for the removal of water and other species as well. Note that the combined $O_2$ and $H_2O$ getter devices encapsulated all in $N_2$ showed shorter lifetimes than $H_2O$ getter only devices encapsulated in $N_2$. Since the total getter area used for each device was approximately the same, it is likely that this reduction in the $H_2O+O_2$ getter lifetime was because the amount of $H_2O$ getter was reduced leading to lower overall $H_2O$ gettering capacity and pumping rate.

The present invention uses combined water, oxygen or other unwanted vapor getters that have sufficient overall capacity such that after some initial air exposure before device sealing there is still sufficient gettering capacity; are slow, delayed or latent acting; or can be later activated by some applied energy or treatment such that residual oxygen, water or other detrimental gases are effectively removed after the encapsulated package is sealed.

Another area where getter material may be particularly useful is near electrical interconnect lines that run from inside the sealed area of an electronic device to outside the sealed area. Patterning the getter material to correspond to the shape of such electrical interconnect lines, or forming a layer of getter material on such lines or in close proximity or adjacent to such lines, provides gettering capacity to a particularly vulnerable area of an encapsulated electronic device.

An example of the encapsulation process of the present invention starts in air with an electronic device formed on a flexible, barrier substrate. An encapsulation film is applied in air, where the film carries a material with combined water, oxygen or other unwanted vapor getter properties. The getter material should have sufficient overall capacity such that (a) after some initial air exposure before device sealing, there is still sufficient gettering capacity; (b) the material is slow, delayed or latent acting; or (c) the material can be later activated by some applied energy or treatment such that residual oxygen, water or other detrimental gases are effectively removed after the encapsulated package is sealed. A dry film adhesive is applied in air to the encapsulation film (with getter) via lamination or other pressure application (application and handling may be assisted by release liners on the adhesive). The encapsulation film (with getter and adhesive) is applied to the device substrate by lamination (for example, utilizing pressure, as with roller lamination, or with vacuum lamination), heat or other means to physically seal the device package and minimize trapped voids. If required, the getter and/or the adhesive are activated through a post-sealing process such as the application of heat (thermal activation), radiation (e.g. optical or electrical), or other activator (e.g. solvent that retards activity of the getter, protection of the getter by a matrix that controls diffusion of contaminants to the getter). The process can include the use of locally applied inert gas purging to reduce $H_2O$, $O_2$, volatile hydrocarbons, or other impurity levels. As an alternative, the getter can be applied to the adhesive as opposed to the encapsulation film. In a variant of the process, the getter may be placed directly onto the device or onto the adhesive, ultimately lying between the device and adhesive in the final package.

While encapsulation may take place in air, in some cases it may be desirable to provide an environment that has levels of oxygen and/or water reduced below certain thresholds that are attainable without sophisticated techniques, such as the range from one ppm to 100 ppm. In some of these cases or in other circumstances it may be desirable to purge the local area where device encapsulation occurs with an inert gas such as nitrogen or a noble gas.

Other variants of the process include the patterning of the getter shape so that it corresponds to the shape of the active area of the device. This patterning may be by a patterned deposition, from a liquid precursor or solid precursor. Application techniques such as by screen printing, dispense printing, jetting, die coating, nozzle coating, gravure coating, electrostatic-assisted printing, offset printing, flexography, and other patterned dispense techniques may be used.

It may be advantageous to apply the getter material first to regions of the adhesive film (particularly those that will correspond to the active area of the device or the interconnects) that is then used in the encapsulation of the device. This allows the use of a preassembled back encapsulation film+adhesive stack to encapsulate the device. However, application of the getter to the adhesive can provide some challenges, as the unwanted sticking of the adhesive to machine parts during the fabrication or encapsulation process can cause problems. Routes to avoid this include using getter deposition techniques, such as dispense printing, pad printing, jet printing, adhesive printing, slot/die coating, or similar techniques which limit machine to adhesive contact outside of the areas where the getter material is actually transferred.

FIG. 5(a) illustrates application of getter to an adhesive using jet printing. Getter ink 52 is added to an adhesive layer 50 through getter ink droplets 54 from a jet printer deposition head 56. FIG. 5(b) illustrates application of getter ink 62 to an adhesive layer 60 through getter ink 64 from a deposition surface 66 in pad printing.

Other means to allow deposition of getter material onto the adhesive and easy assembly include the use of masking films. Masking films can be placed over the adhesive surface before the getter is to be deposited. The masking film can then be later removed to expose the adhesive for sealing of the device. To assist this removal in the areas where adhesive is to be exposed, without disturbing the getter coated areas, it may be advantageous to die cut, "kiss cut", or partially perforate the masking film.

Other variants of the process include use of a thin sheet based getter material which is patterned by cutting, drilling or other mechanical shaping.

Although the present invention has been particularly described with reference to embodiments thereof, it should be readily apparent to those of ordinary skill in the art that various changes, modifications and substitutes are intended within the form and details thereof, without departing from the spirit and scope of the invention. Accordingly, it will be appreciated that in numerous instances some features of the invention will be employed without a corresponding use of other features. Further, those skilled in the art will understand that variations can be made in the number and arrangement of components illustrated in the above figures.

The invention claimed is:

1. A method for forming an electronic device in an encapsulated package, comprising the steps of:

forming an electronic device on a flexible substrate that serves as a barrier to liquids and gases;

forming a layer of dry film adhesive;

forming a layer of getter material at least partially in contact with the layer of dry film adhesive, wherein the getter material is temporarily inactive, of reduced activity or latent acting when the layer of getter material is formed, and activating the getter material after the encapsulated package is sealed;

forming a flexible encapsulation film in contact with at least one of the layer of dry film adhesive and the layer of getter material; and applying the flexible encapsulation film, layer of getter material and layer of dry film adhesive to the substrate while at least one of the getter material and electronic device is exposed to air, thereby forming a sealed encapsulated package comprising air, wherein the layer of dry film adhesive is used to adhere the encapsulation film to the substrate and overlays the electronic device.

2. The method of claim 1, wherein the getter material is activated through a technique selected from a group consisting of thermal activation, electrical activation, optical activation, removal of a solvent that retards activity of the getter material, and protection of the getter material by a matrix that controls diffusion of contaminants to the getter material.

3. The method of claim 1, wherein the layer of getter material is formed adjacent to a backside of the encapsulation film or adjacent to a top side of the electronic device.

4. A method for forming an electronic device in an encapsulated package, comprising the steps of:
   forming an electronic device on a flexible substrate that serves as a barrier to liquids and gases;
   forming a layer of dry film adhesive;
   forming a layer of getter material at least partially in contact with the layer of dry film adhesive, wherein the layer of getter material is formed over the electronic device;
   forming a flexible encapsulation film in contact with at least one of the layer of dry film adhesive and the layer of getter material; and
   applying the flexible encapsulation film, layer of getter material and layer of dry film adhesive to the substrate while at least one of the getter material and electronic device is exposed to air, thereby forming a sealed encapsulated package comprising air, wherein the layer of dry film adhesive is used to adhere the encapsulation film to the substrate and overlays the electronic device.

5. The method of claim 4, wherein the getter material is temporarily inactive when the layer of getter material is formed, and the method further comprises activating the getter material after the encapsulated package is sealed.

6. The method of claim 4, wherein the getter material is of reduced activity or latent acting when the layer of getter material is formed, and the method further comprises activating the getter material after the encapsulated package is sealed.

7. The method of claim 1, wherein the step of forming the flexible encapsulation film comprises sealing the encapsulation film over the electronic device and substrate using the adhesive.

8. The method of claim 7, wherein the dry film adhesive is formed in air.

9. The method of claim 1, wherein the adhesive is applied between the getter material and the electronic device.

10. The method of claim 1, wherein the adhesive is applied between the encapsulation film and the getter material.

11. The method of claim 1, wherein the layer of getter material is patterned to correspond to the shape of the active area of the electronic device.

12. The method of claim 1, wherein the getter material is formed by deposition from a liquid precursor.

13. The method of claim 12, wherein the getter material is formed by printing.

14. The method of claim 1, wherein the getter material removes a material selected from a group consisting of water, oxygen, hydrogen, and residual solvents.

15. The method of claim 1, wherein the sealing is performed in an environment with at least one part per million of water.

16. The method of claim 1, wherein the layer of getter material is formed over the adhesive.

17. The method of claim 16, wherein the layer of getter material is formed over the adhesive using a technique that reduces contact between the printer and the adhesive in areas of the adhesive where getter is not applied.

18. The method of claim 1, wherein the layer of getter material is formed by a technique selected from a group consisting of flexographic printing, pad printing, jet printing, and dispense printing.

19. The method of claim 1, wherein the layer of getter material is formed over the adhesive and the adhesive is at least partially covered by a non-adhesive film.

20. The method of claim 1, wherein the layer of getter material is patterned to correspond to an electrical interconnect line that runs from inside the encapsulated package to outside the encapsulated package.

21. The method of claim 1, wherein at least part of the layer of getter material is formed over an electrical interconnect line that runs from inside of the encapsulated package to outside the encapsulated package.

22. The method of claim 1, wherein a least part of the layer of getter material is formed on the encapsulation film so that it is located in close proximity to an electrical interconnect line that runs from inside the encapsulated package to outside the encapsulated package.

* * * * *